US008539418B1

United States Patent
Padalia et al.

(10) Patent No.: US 8,539,418 B1
(45) Date of Patent: Sep. 17, 2013

(54) METHOD AND APPARATUS FOR PERFORMING EFFICIENT INCREMENTAL COMPILATION

(75) Inventors: Ketan Padalia, Thornhill (CA); Ryan Fung, Mississauga (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/600,371

(22) Filed: Aug. 31, 2012

Related U.S. Application Data

(62) Division of application No. 12/655,864, filed on Jan. 8, 2010, now Pat. No. 8,281,274.

(51) Int. Cl.
*G06F 17/50* (2006.01)

(52) U.S. Cl.
USPC ............ 716/121; 716/126; 716/128; 716/132

(58) Field of Classification Search
USPC .................................. 716/121, 126, 128, 132
See application file for complete search history.

(56) References Cited

U.S. PATENT DOCUMENTS

| | | | |
|---|---|---|---|
| 5,764,525 A | 6/1998 | Mahmood et al. | |
| 6,145,117 A | 11/2000 | Eng | |
| 6,367,056 B1 * | 4/2002 | Lee | 716/113 |
| 7,493,585 B1 * | 2/2009 | Ahmed et al. | 716/105 |
| 7,694,256 B1 | 4/2010 | Galloway et al. | |
| 7,853,915 B2 | 12/2010 | Saxena et al. | |
| 8,281,274 B1 | 10/2012 | Padalia et al. | |
| 2007/0198971 A1 * | 8/2007 | Dasu et al. | 717/140 |
| 2010/0122105 A1 * | 5/2010 | Arslan et al. | 713/500 |
| 2011/0140278 A1 | 6/2011 | Chen et al. | |

\* cited by examiner

*Primary Examiner* — Naum Levin
(74) *Attorney, Agent, or Firm* — L. Cho

(57) ABSTRACT

A method for designing a system on a target device includes identifying candidate portions in the system to preserve based on similarities between the system and another system. Preservation criteria are applied on the candidate portions in the system to preserve to identify portions of the system to preserve. Design results from the another system are reused for portions in the system that are preserved.

24 Claims, 7 Drawing Sheets

METHOD AND APPARATUS FOR PERFORMING EFFICIENT INCREMENTAL COMPILATION

RELATED APPLICATION

This application is a divisional of and claims benefit and priority to U.S. Pat. No. 8,281,274 filed on Jan. 8, 2010, entitled "METHOD AND APPARATUS FOR PERFORMING EFFICIENT INCREMENTAL COMPILATION".

TECHNICAL FIELD

The present invention relates to electronic design automation tools for designing systems on target devices. More specifically, the present invention relates to a method and apparatus for performing efficient incremental compilation.

BACKGROUND

Target devices such as field programmable gate arrays (FPGAs), structured application specific integrated circuits (ASICs), and ASICs are used to implement large systems that may include million of gates and megabits of embedded memory. The complexity of large systems often requires the use of electronic design automation (EDA) tools to create and optimize a design for the system onto physical target devices. Among the procedures performed by EDA tools in a computer aided design (CAD) flow are synthesis, placement, and routing. When designing large systems to be implemented on large target devices, EDA tools may require a large amount of time to perform iterations of the procedures.

When making changes to large systems, it is typically more common for designers to modify localized portions of a design rather than making radical changes to large portions of the system. When making such localized changes, it is undesirable to have the EDA tool process the entire system from scratch because the designer may be satisfied with the results of unmodified portions of the system and re-processing the unmodified portions may change the design unfavorably. In addition, a large amount of time would be required to process the entire circuit from scratch.

Incremental compilation is a design methodology that involves re-processing only modified portions of a system. Previously determined design results are used for unmodified or "preserved" portions of the system.

SUMMARY

According to an embodiment of the present invention, a set of preservation criteria is used to apply/remove preservation constraints to facilitate legal design implementation and/or improve optimization while saving compilation run time. The preservation constraints may be further applied to reduce runtime of flat compiles. The preservation constraints may be applied automatically or when conditions are triggered such as when cost values are attained. Data structures associated with portions of the system subject to the preservation constraints may be pruned to improve compilation runtime savings. According to one aspect of the present invention, candidate portions in a system are identified to preserve based on similarities between the system and another system. Preservation criteria are applied to identify portions of the system to preserve. Preservation constraints may be used to enforce preservation of the portions of the system to preserve. Design results from the other system are reused for portions of the system that are preserved.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. However, it will be apparent to one skilled in the art that specific details in the description may not be required to practice the embodiments of the present invention. In other instances, well-known components, programs, and procedures are shown in block diagram form to avoid obscuring embodiments of the present invention unnecessarily.

Figure 1:
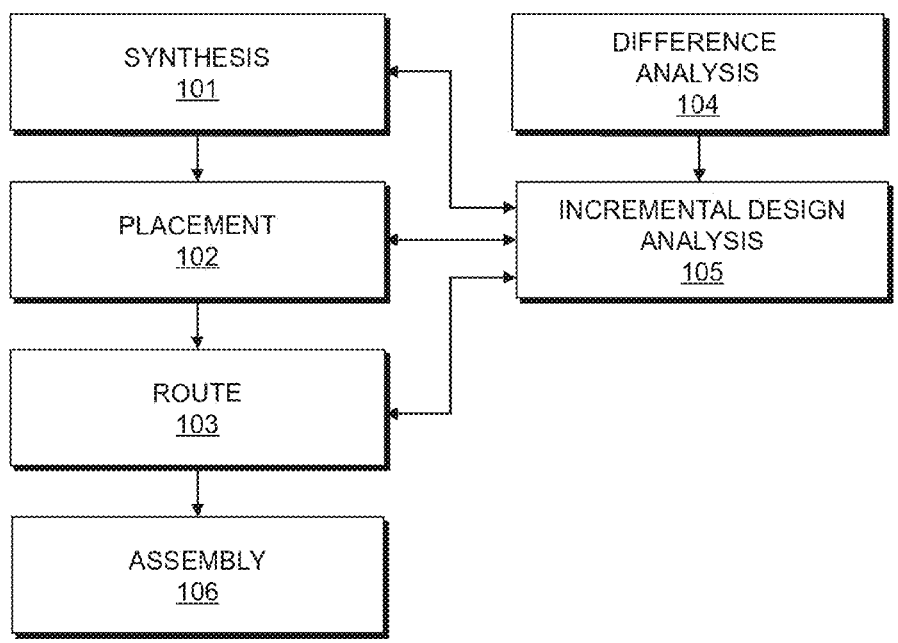
FIG. 1 is a flow chart illustrating a method for designing a system on a target device using incremental compilation according to an embodiment of the present invention.

FIG. 1 is a flow chart illustrating a method for designing a system on a target device according to an embodiment of the present invention. The target device may be an FPGA, ASIC, a structured ASIC, or other device. According to an embodiment of the present invention, the methodology described with reference to FIG. 1 may be performed by an EDA tool. Each of the procedures in FIG. 1 may be performed automatically by the EDA tool without user intervention. At 101, the system is synthesized. Synthesis includes generating a logic design of the system to be implemented by a target device. According to an embodiment of the present invention, synthesis generates an optimized logical representation of the system from an HDL design definition. Synthesis also includes mapping the optimized logic design. Mapping includes determining how to implement logic gates and logic elements in the optimized logic representation with specific resources on the target device. According to an embodiment of the present invention, a netlist is generated from mapping. This netlist may be an optimized technology-mapped netlist generated from the HDL.

At 102, the system is placed. According to an embodiment of the present invention, placement involves placing the mapped logical system design on the target device. Placement works on the optimized technology-mapped netlist to produce a placement for each of the functional blocks. According to an embodiment of the present invention, placement includes fitting the system on the target device by determining which resources on the target device are to be used for specific logic gates and logic elements in each functional block.

At 103, it is determined which routing resources should be used to connect the components in the target device implementing the functional blocks in the system. During routing, routing resources on the target device are allocated to provide interconnections between logic gates, logic elements, and other components on the target device.

According to an embodiment of the present invention, after running procedures 101-103, changes may be made to the original HDL design definition of the system. Instead of processing the entire HDL design definition of the modified system with procedures 101-103, only portions of the modified system are re-processed. Other portions of the system are preserved and design results associated with the preserved portions of the system are re-used. In this embodiment, procedures 104 and 105 may be performed on the modified design prior to performing procedures 101-103 on the modified system.

At 104, an analysis is performed to identify the differences between portions of the compiled design which have been synthesized, placed, and routed and the modified system which has yet to be synthesized, placed, and routed. It should be appreciated that a "portion" may describe an entire section or area of a system, a path or a connection in the system, a component or a basic building block in the system, or other physical aspect of the system. According to an embodiment of the present invention, user-defined partitions and preservation settings are used to identify which portions of the system have changed. According to an alternate embodiment of the present invention, difference analysis may be performed automatically by the EDA tool. In this embodiment, a comparison may be made between the original design and the changed version of the design. The comparison may be made at a high level to determine, for example, which HDL files have changed and what entities have changed. Alternatively, the comparison may be made at a low level to determine, for example, which look up tables and registers have changed. It should be appreciated that other levels of comparisons may be performed. Portions of the system design which have not changed or been modified are identified as candidate portions in the system to preserve.

At 105, an analysis is performed on the changed system. When only a portion of the system has been modified, the advantage of re-using design results from the non-modified portions of the system is that run-time is saved by not having to process the entire system. In addition, the overall design for the system may be more stable when re-using the design results. When placement and routing are re-executed on unchanged portions of the system, a different implementation of the design may be created with changes in timing performance which may be undesirable. However, some of the unmodified portions of the system may interact with the modified portions and thus may benefit from not having their physical implementation (design results) preserved and reused, but recompiled with the modified portions. The analysis performed at 105 evaluates the candidate portions in the system to preserve and identifies portions to preserve. According to an embodiment of the present invention, during incremental design analysis 105, a set of preservation criteria is applied to the candidate portions to eliminate some of the candidate portions and to designate other candidate portions to be recompiled with the modified portions. Preservation constraints may be used to enforce preservation of the portions.

As illustrated in FIG. 1, incremental design analysis 105 may be performed during one or more of the synthesis 101, placement 102, and routing 103 procedures to identify portions to preserve for incremental compilation. When being performed during placement 102 and routing 103, incremental design analysis 105 may compare design results generated from a prior procedure in the compilation flow of a changed/modified design with corresponding design results from the original design. The incremental design analysis procedure returns the identity of portions to preserve and portions to recompile back to the one or more synthesis 101, placement 102, or routing 103 procedures.

At 106, an assembly procedure is performed. The assembly procedure involves creating a data file that includes some of the information determined by the procedure described by 101-105. The data file may be a bit stream that may be used to program the target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

Figure 2:
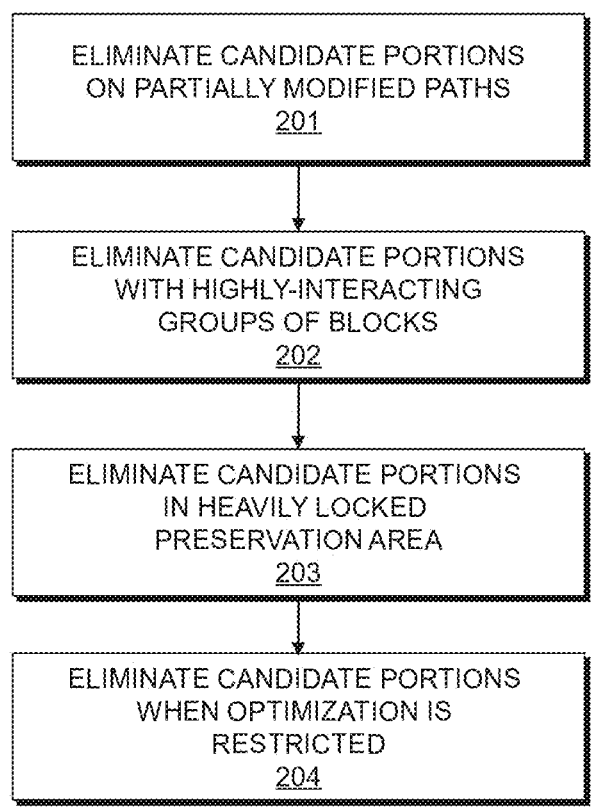
FIG. 2 is a flow chart illustrating a method for performing incremental design analysis according to an embodiment of the present invention.

FIG. 2 is a flow chart illustrating a method for evaluating candidate portions for preservation according to an embodiment of the present invention. The method illustrated in FIG. 2 may be used to implement the incremental design analysis procedure 105 illustrated in FIG. 1 in part. At 201, candidate portions that make a path that is partially modified are eliminated as a candidate portion for preservation. A path may include multiple connections between blocks. If a first connection is modified while a second connection is not, preserving the placement and routing design results for the unmodified connections may adversely impact timing closure since the properties of the entire timing path may require more optimization along the entire path. According to an embodiment of the present invention, a timing netlist can evaluated to identify unmodified connections on a path having at least one modified path. The identified unmodified paths will not be portions in the system that are preserved during incremental compilation.

At 202, candidate portions that are highly interactive with non-candidate portions are eliminated as candidate portions for preservation. Certain groups of blocks may have a high level of interaction with other blocks. For example, logic elements within a logic array block in an FPGA have a tendency to have a high level of interaction. When attempting to optimize a first set of blocks in a design, if the first set of blocks are highly interactive with a second set of blocks that have their placement and routing design results preserved (locked), optimization may be difficult. In such situations, it may be beneficial to not preserve any design results for the second set of blocks.

At 203, candidate portions that are in an area of the system with a large number of other candidate portions are eliminated as candidate portions for preservation. Areas in a system having a large amount of locked logic may be difficult to optimize because the rest of the system has to be placed and routed around the locked logic. Unlocking portions that would otherwise be preserved in the system may provide needed flexibility to increase optimization. According to an embodiment of the present invention, various metrics may be analyzed to determine whether to eliminate candidate portions. For example, congestion, timing performance, logic density, power, clocking flexibility, and shared resource availability may be metrics that are analyzed. Based on this analysis, some candidate portions that could be designated as a portion to be preserved would be eliminated as a candidate and would not be preserved in order to best optimize the design.

According to an embodiment of the present invention, procedure 203 considers not only candidate portions in the system to preserve, but also other adjacent portions of the design to avoid inhibiting optimization. The adjacent portions may have adjacency through a netlist or floorplan proximity. Procedure 203 applies preservation constraints to whole regions of a floorplan and portions of a design rather than to small chunks of the design to reduce the impact on portions of the design that may still need further optimization.

It should be appreciated that procedures 201-203 may be performed prior to synthesis 101, placement 102, or routing 103 (shown in FIG. 1) in order to provide the synthesis 101, placement 102, or routing 103 procedures the identity of portions of the system to preserve and thus reduce the amount of processing required by the procedures for incremental compilation. After synthesis 101, placement 102, or routing 103 is initiated for incremental compilation, it may be discovered that the preservation decisions made at 201-203 conflict with the optimization goals of the synthesis 101, placement 102, or routing 103 procedures.

At 204, decisions to preserve portions of the system are reversed if optimization conflicts with the preservation decisions. According to an embodiment of the present invention, optimization procedures implemented in synthesis, placement, or routing that are based on making changes to a tentative design implementation record when proposed changes conflict with constraints for preservation implemented to enforce a portion that is preserved. For example, if the optimization procedure proposes a placement swap involving a constrained block, that constrained block is recorded or if the optimization procedure would like to use a routing resource that is used by a constrained signal, that routing resource can be recorded. Based on this conflict data recorded, preservation constraints may be removed to facilitate current or later optimization. Analysis of the conflict data may consider that not all relevant constraints need be removed in order facilitate optimization.

Procedures 201-204, may be applied at different points in a compilation flow, during an initial design of a system, or an incremental recompilation flow where modifications are made to a design of a system. These procedures may be applied at algorithm/procedure boundaries. For example, a routing procedure may choose to preserve only a part of a portion of the system preserved during placement. These procedures may also be applied within an algorithm/procedure. For example, during a placement procedure, preservation constraints may be added to the design of the system while preservation constraints are removed from the design of the system.

It should be appreciated that the preservation constraints used to enforce the portions of the system to preserve may be applied either as hard constraints which must be precisely obeyed, or as soft constraints which may be ignored under predefined circumstances. According to an embodiment of the present invention, a cost function may be implemented to trigger enforcement or removal of preservation constraints based upon objectives related to optimization, compilation time, design quality, and/or other criteria.

Alternatively, the optimization tool can be discouraged (but not prevented) from suggesting changes to portions of the design which are marked for preservation to reduce optimization effort and save compile time. The advantage of the soft application of preservation constraints is algorithms can be more aggressive in applying them without degrading solution quality because they are only respected to a degree that can be favorably tuned.

It should further be appreciated that the procedures described with reference to 104-105 of FIG. 1 and 201-204 of FIG. 2 may be used to apply preservation constraints on portions of a system as optimization proceeds based on a tentative solution during a design of a system or a portion of a system, such as a flat compile where no previous design results have been generated or after changes have been made to a non-preserved portion of the design on a subsequent compile. Iterative improvement algorithms/procedures refine tentative design implementations to achieve a final optimized solution. As an iterative improvement algorithm/procedure proceeds, portions of a design may achieve near-optimal and/or constraint satisfying solution quality before other portions of the system. When this occurs, the portions of the design that are deemed sufficiently optimized may be constrained to avoid wasted work on those portions of the design and to avoid de-optimization. Various metrics may be analyzed to determine whether a portion of the system should be preserved. For example, congestion, timing performance, logic density, power, clocking flexibility, shared resource availability, and other criteria may be used.

After it is determined to preserve portions of a system, a further procedure for increasing runtime benefits is to remove portions of the data structure associated with the preserved portions or to build a proper subset of the data structure upon which the compilation procedures operate on. Unused or preserved portions of the device-centric data structures may be pruned. According to an embodiment of the present invention, the data structures may be netlists of the system.

Pruning the data structure benefits the runtime of algorithms or procedures that cannot easily be made more incremental by modifying them to ignore and not process portions of the design which are to be preserved. The difficulty in making these modifications are due to the size and complexity of their associated code. Many algorithms and procedures that operate on a portion of a data structure may still do full passes of the full data structure to facilitate incremental processing. The advantage of building pruned data structures, such as netlists, is to allow non-incremental algorithms or procedures to benefit from a one time data reduction that reduces the work set of all algorithms or procedures that use the data structure.

Figure 3:
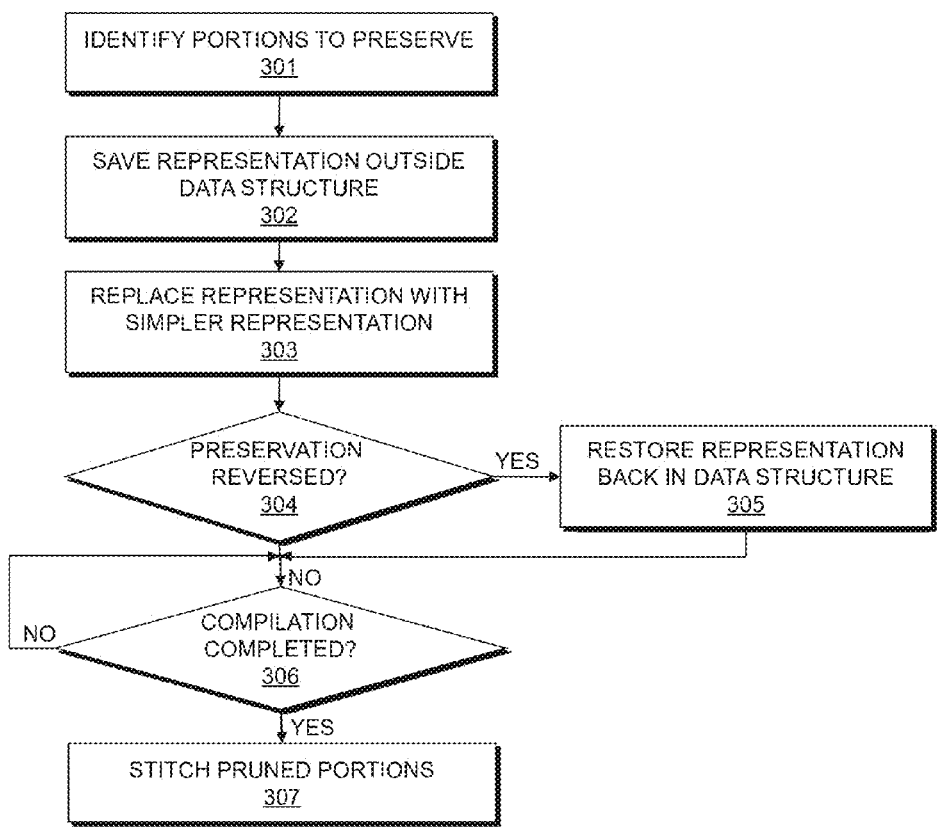
FIG. 3 is a flow chart illustrating a method for pruning a data structure according to an embodiment of the present invention.

FIG. 3 is a flow chart illustrating a method for pruning a data structure according to an embodiment of the present invention. The method illustrated in FIG. 3 may be used to implement the incremental design analysis procedure 105 illustrated in FIG. 1 in part. At 301, portions in the system to preserve are identified. According to an embodiment of the present invention, the procedure illustrated in FIG. 2 may be used to implement 301.

At 302, representations of the portions in the system to preserve are saved outside the data structure. This saved copy of the representation will be used to restore the data structure after the compilation procedure is completed or in the event that preservation decisions are reversed.

At 303, representations of the portions in the system to preserve are replaced with a simpler representation. In order for algorithms and procedures to work with pruned data structures, it may be necessary to maintain some data about the blocks or resources that were pruned. For example, during placement, it may be necessary to model the "foot print" for blocks that were pruned from the data structure to avoid illegal placements when the relevant portions of the design are stitched back in. Similarly, during routing, it may be necessary to reserve the respective routing resources to avoid overusing tracks that have already been assigned to signals that were pruned from the data structure. The reservation of placement and routing resources may be fine-grained based on the exact resources utilized based on previous results. Alternatively, the reservations may be coarse-grained where whole regions of the floorplan or routing network are reserved based on preservation choices.

According to an embodiment of the present invention, to correctly evaluate design objectives such as functionality, legality, and timing, portions of the design or device that would otherwise have been pruned are included in the data structure. For example, the non-pruned portion of the design may be expanded to include all design elements up to, and including, register boundaries so that timing analysis can accurately assess the slacks of paths subject to change. Similarly, the non-pruned portion of the design may be expanded to include the relevant clocking logic. For some metrics, such as design congestion or power, rather than including all relevant portions of the detailed design data, global or regional statistics can be recorded to model, in a more abstract/data-reduced manner, the impact of pruned portions of the design on these metrics.

At 304, it is determined whether a preservation decision is reversed. According to an embodiment of the present invention, a preservation decision may be reversed after a compilation or incremental compilation procedure is performed and it is determined that a portion in the system design that has been preserved should be recompiled in order to increase optimization. If a preservation decision is reversed, control proceeds to 305. If a preservation decision is not reversed, control proceeds to 306.

At 305, the representation of the portion of the system corresponding to the reversed preservation decision is written back into the data structure. When a preservation decision is reversed or if additional data associated with a preserved portion is needed to properly optimize a non-preserved portion of a system, the representation corresponding to the preserved portion is written (stitched) back into the data structure. For example, a router may need data about signals missing from a data structure that must be re-routed if a preservation decision is reversed. Changes to the preservation decisions may be expensive because it requires that data structure, and any associated data structures, be re-built. Thus, while more aggressively pruning may offer the potential for more runtime savings, the aggressive pruning may come at a cost of increased runtime penalty if the pruning decisions need to be reversed.

Different data structures may benefit from differing degrees of pruning. Data structures used solely for optimization can be pruned more aggressively than data structures used to check legality and preserve functionality. For example, the timing graph and any data mappings associated with the timing graph can generally be pruned very aggressively because even if the decision to preserve a portion of the system is reversed, the timing graph need not be updated if meeting timing on that portion of the design is not a concern.

According to an embodiment of the present invention, an approach can be taken to reduce the likelihood that optimization data structures need to be re-built. Simple constraints are applied to encourage optimization tools to achieve materially equivalent solutions to what the optimization tool is attempting to preserve. For example, minimum and maximum delay targets are applied to achieve a similar routed connected delay, reducing the need for performing a precise timing analysis on a portion of the data structure which is selected for re-routing. Similarly, connection delay targets or region constraints can be applied to blocks that need to be replaced.

According to an embodiment of the present invention, aggressive pruning is applied only to higher-level data structures that most optimization algorithms operate off, such as timing graphs and coarse-grained abstractions of detailed netlists, to reduce the need to re-stitch missing components and re-build netlists. In this embodiment, only the higher-level data structures require re-building rather than all data structures.

At 306, it is determined whether compilation is completed. The compilation may involve performing synthesis, placement, and routing procedures on a system during a flat compile or during incremental compilation. If compilation is completed control proceeds to 307. If compilation is not completed, control returns to 306.

At 307, the pruned representations are stitched together with the design results determined from compilation. At the end of processing, a complete legal design implementation is required. Consequently, the pruned portions of data structures are stitched back in and the previous design results are restored to complete the design implementation.

It should be appreciated that data structure pruning may be applied to flat compiles without previous results to work from. As optimization goals are achieved and attention can be focused on portions of the design that need further optimization, preservation constraints can be applied and relevant data structures may be pruned to reduce wasted effort and runtime.

Figure 4:
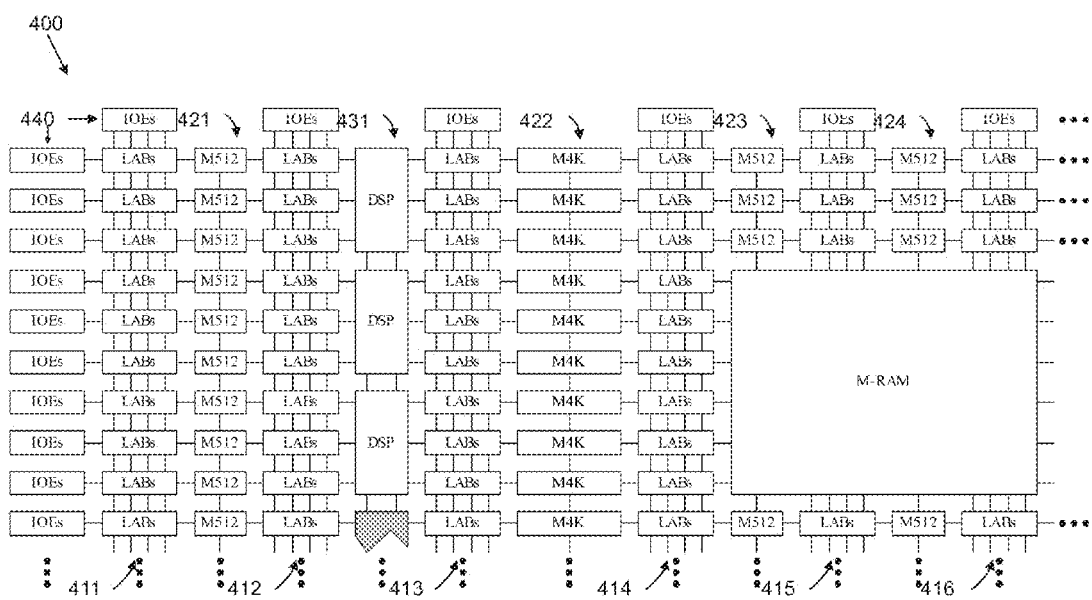
FIG. 4 illustrates a target device according to an embodiment of the present invention.

FIG. 4 illustrates a target device according to an embodiment of the present invention. The target device 400 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input lookup table (LUT) with a configurable register. According to an alternate embodiment of the present invention, the logic block may operate similarly to an adaptive logic module (ALM), such as those found in Stratix devices manufactured by Altera Corporation. LABs are grouped into rows and columns across the target device 400. Columns of LABs are shown as 411-416. It should be appreciated that the logic block may include additional or alternate components.

The target device 400 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 400. Columns of memory blocks are shown as 421-424.

The target device 400 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 400 and are shown as 431.

The target device 400 includes a plurality of input/output elements (IOEs) 440. Each IOE feeds an IO pin (not shown) on the target device 400. The IOEs 440 are located at the end of LAB rows and columns around the periphery of the target device 400. Each IOE may include a bidirectional IO buffer and a plurality of registers for registering input, output, and output-enable signals.

The target device 400 may include routing resources such as LAB local interconnect lines, row interconnect lines ("H-type wires"), and column interconnect lines ("V-type wires") (not shown) to route signals between components on the target device.

FIG. 4 illustrates an exemplary embodiment of a target device. It should also be appreciated that, as indicated above, the target device may include the same or different semiconductor devices arranged in a different manner. The target device 400 may also include FPGA resources other than those described and illustrated with reference to the target device illustrated in FIG. 4. Thus, while embodiments of the invention described herein may be utilized on the architecture described in FIG. 4, it should be appreciated that it may also be utilized on different architectures.

Figure 5:
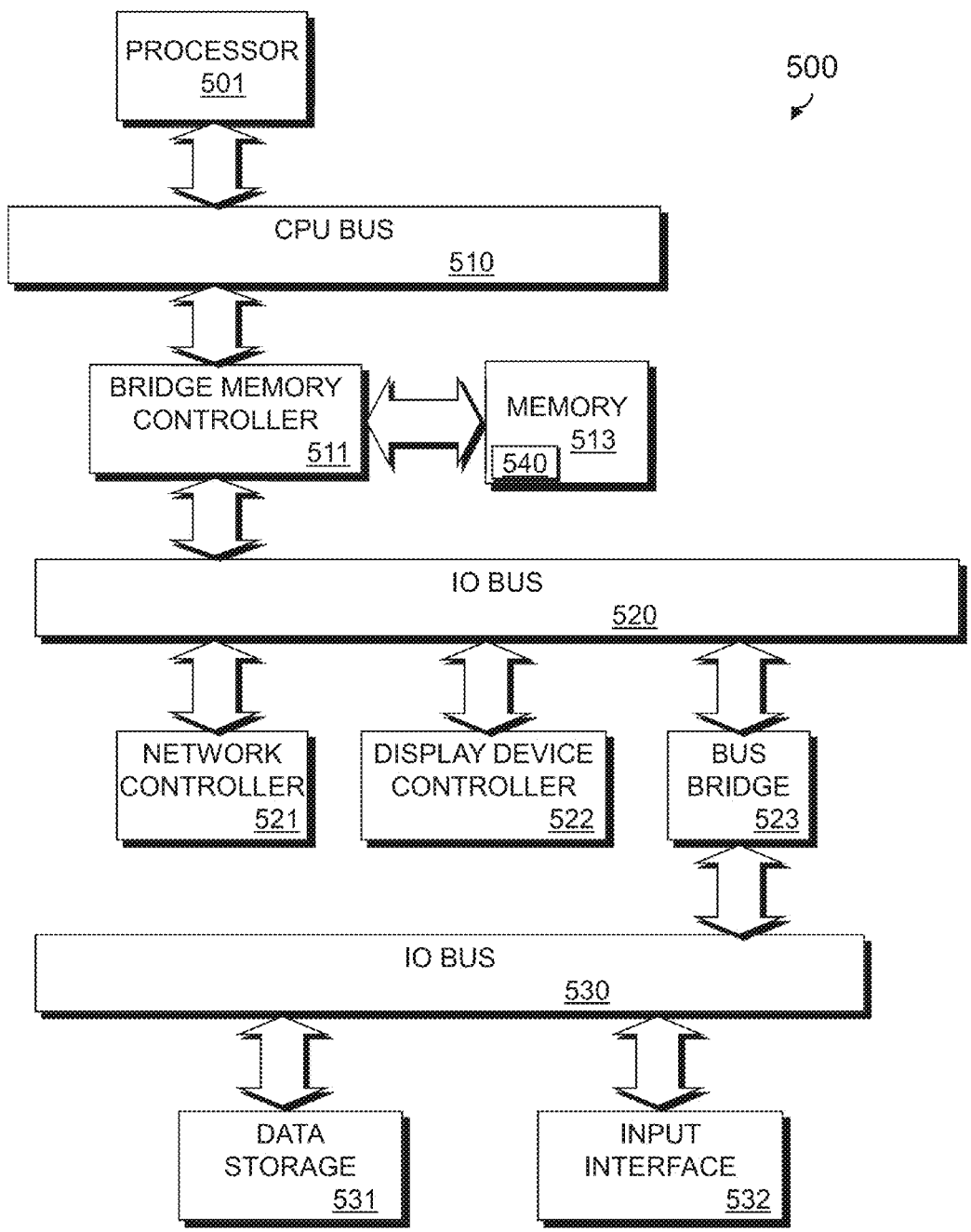
FIG. 5 illustrates a computer system on which a system designer resides according to an embodiment of the present invention.

FIG. 5 is a block diagram of an exemplary computer system 500 in which an example embodiment of the present invention resides. The computer system 500 includes a processor 501 that processes data signals. The processor 501 is coupled to a CPU bus 510 or other switch fabric that transmits data signals to other components in the computer system 500.

The computer system 500 includes a memory 513. The memory 513 may store instructions and code represented by data signals that may be executed by the processor 501. A bridge memory controller 511 is coupled to the CPU bus 510 and the memory 513. The bridge memory controller 511 directs data signals between the processor 501, the memory 513, and other components in the computer system 500 and bridges the data signals between the CPU bus 510, the memory 513, and a first IO bus 520. According to an embodiment of the present invention, the processor 501 may be directly coupled to the memory 513 and communicates with the memory 513 without a bridge memory controller 511.

The first IO bus 520 may be a single bus or a combination of multiple buses. The first IO bus 520 provides communication links between components in the computer system 500. A network controller 521 is coupled to the first IO bus 520. The network controller 521 may link the computer system 500 to a network of computers (not shown) and supports communication among the machines. A display device controller 522 is coupled to the first IO bus 520. The display device controller 522 allows coupling of a display device (not shown) to the computer system 500 and acts as an interface between the display device and the computer system 500.

A second IO bus 530 may be a single bus or a combination of multiple buses. The second IO bus 530 provides communication links between components in the computer system 500. A data storage device 531 is coupled to the second IO bus 530. An input interface 532 is coupled to the second IO bus 530. The input interface 532 allows coupling of an input device to the computer system 500 and transmits data signals from an input device to the computer system 500. A bus bridge 523 couples the first IO bus 520 to the second IO bus 530. The bus bridge 523 operates to buffer and bridge data signals between the first IO bus 520 and the second IO bus 530. It should be appreciated that computer systems having a different architecture may also be used to implement the computer system 500.

A system designer 540 may reside in memory 513 and be executed by the processor 501. The system designer 540 may operate to synthesize a system, place the system on a target device, route the system on the target device, and assemble the system. The system designer 540 may also operate to perform a difference analysis to identify differences between a first design for a system and a second design for a system, and perform incremental design analysis to strategically apply/remove preservation constraints to facilitate legal design implementation and/or improve optimization while saving runtime. The system designer 540 may leverage soft preservation to aggressively reduce optimization affords on portions of a system without sacrificing quality. The system designer 540 may also prune data structures that are analyzed during compilation and incremental compilation based on preservation choices to increase runtime savings.

Figure 6:
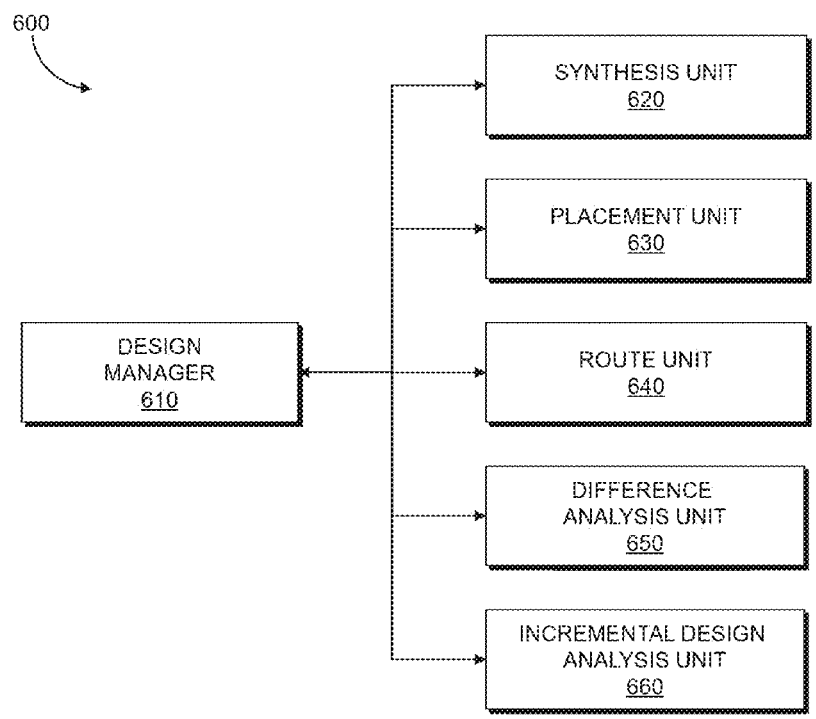
FIG. 6 illustrates a system designer according to an embodiment of the present invention.

FIG. 6 illustrates a system designer 600 according to an embodiment of the present invention. The system designer 600 may be an EDA tool and be used to implement the system designer 540 illustrated in FIG. 5. FIG. 6 illustrates software modules implementing an embodiment of the present invention. According to one embodiment, system design may be performed by a computer system (not shown) executing sequences of instructions represented by the software modules shown in FIG. 6. Execution of the sequences of instructions causes the computer system to support system design as will be described hereafter. In alternate embodiments, hard-wired circuitry may be used in place of or in combination with software instructions to implement the present invention. Thus, the present invention is not limited to any specific combination of hardware circuitry and software. The system designer 600 includes a system designer manager 610. The system designer manager 610 is coupled to and transmits information between components in the system designer 600.

The system designer 600 includes a synthesis unit 620. The synthesis unit 620 generates a logic design of a system to be implemented by a target device. According to an embodiment of the system designer 600, the synthesis unit 620 takes a conceptual Hardware Description Language (HDL) design definition and generates an optimized logical representation of the system. The optimized logical representation of the system generated by the synthesis unit 620 may include a representation that has a minimized number of functional blocks and registers, such as logic gates and logic elements, required for the system. Alternatively, the optimized logical representation of the system generated by the synthesis unit 620 may include a representation that has a reduced depth of logic and that generates a lower signal propagation delay. The synthesis unit 620 also determines how to implement the functional blocks and registers in the optimized logic representation utilizing specific resources on a target device, thus creating an optimized post-synthesis netlist for each of the partitions in the system. The post-synthesis netlist indicate how the resources on the target device can be utilized to implement the system. The post-synthesis netlist may, for example, include components such as LEs on the target device.

The system designer 600 includes a placement unit 630. The placement unit 630 fits the system on the target device by determining which resources on the target device are to be used for specific functional blocks and registers. According to an embodiment of the system designer 630, the placement unit 630 first determines how to implement portions of the optimized logic design in clusters. Clusters may represent a proper subset of the components on the target device such as, for example, a LAB having a plurality of logic blocks. In this embodiment, after portions of the optimized logic design are implemented in clusters, the clusters may be placed by assigning the clusters to specific LABs on the target device.

The system designer 600 includes a routing unit 640. The routing unit 640 determines the routing resources on the target device to use to provide interconnection between the functional blocks and registers on the target device.

The system designer 600 includes a difference analysis unit 650. The difference analysis unit 650 identifies the differences between portions of the compiled design which have been synthesized, placed, and routed and a modified system which has yet to be synthesized, placed, and routed. It should be appreciated that a "portion" may describe an entire section or area of a system, a path or a connection in the system, a component or a basic building block in the system, or other physical aspect of the system. According to an embodiment of the present invention, the difference analysis unit 650 includes a user interface that allows a user to enter user-defined partitions and preservation settings which are used to identify which portions of the system have changed. According to an alternate embodiment of the present invention, the difference analysis unit 650 performs difference automatically without utilizing user input. In this embodiment, a comparison may be made between the original design and the changed version of the design. The comparison may be made at a high level to determine, for example, which HDL files have changed and what entities have changed. Alternatively, the comparison may be made at a low level to determine, for example, which look up tables and registers have changed. It should be appreciated that other levels of comparisons may be performed. Portions of the system design which have not changed or been modified are identified as candidate portions in the system to preserve.

The system designer 600 includes an incremental design analysis unit 660. The incremental design analysis unit 660 evaluates the candidate portions in the system to preserve and identifies portions to preserve (preserved portions). According to an embodiment of the present invention, the incremental design analysis unit applies a set of preservation criteria to the candidate portions to eliminate some of the candidate portions and to designate other candidate portions to be recompiled with the modified portions. Preservation constraints are applied to enforce preservation of the portions.

According to an embodiment of the system designer 600, the system design manager 610 performs an assembly procedure that creates a data file that includes the design of the system generated by the system designer 600. The data file may be a bit stream that may be used to program the target device. The system design manager 610 may output the data file so that the data file may be stored or alternatively transmitted to a separate machine used to program the target device. It should be appreciated that the system design manager 610 may also output the design of the system in other forms such as on a display device or other medium.

The system designer 600 may also be used to apply preservation constraints on portions of a system as optimization proceeds based on a tentative solution during a design of a system or a portion of a system, such as a flat compile where no previous design results have been generated or after changes have been made to a non-preserved portion of the design on a subsequent compile. Iterative improvement algorithms/procedures refine tentative design implementations to achieve a final optimized solution. As an iterative improvement algorithm/procedure proceeds, portions of a design may achieve near-optimal and/or constraint satisfying solution quality before other portions of the system. In this embodiment, the system designer 600 may include a quality analysis unit (not shown) to determine a quality of a design result of one or more portions of a system. When this occurs, the portions of the design that are deemed sufficiently optimized may be constrained to avoid wasted work on those portions of the design and to avoid de-optimization. Various metrics may be analyzed to determine whether a portion of the system should be preserved. For example, congestion, timing performance, logic density, power, clocking flexibility, shared resource availability, and other criteria may be used.

Figure 7:
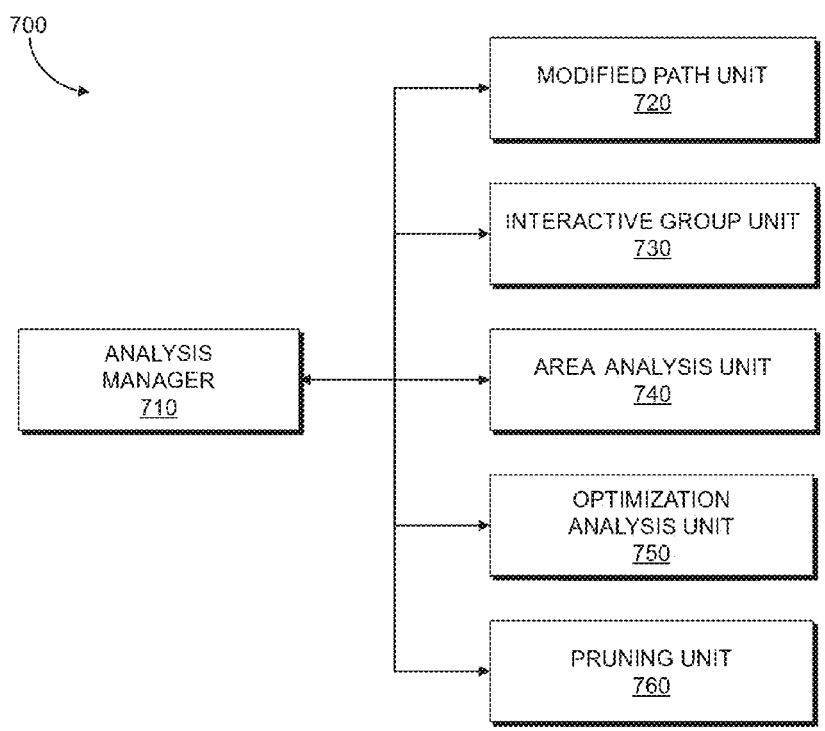
FIG. 7 illustrates an incremental design analysis unit according to an embodiment of the present invention.

FIG. 7 illustrates an incremental design analysis unit 700 according to an embodiment of the present invention. The incremental design analysis unit 700 may be used to implement the incremental design analysis unit 660 illustrated in FIG. 6. The incremental design analysis unit 700 includes an analysis manager 710. The analysis manager 710 is coupled to and transmits data and information between the components in the incremental design analysis unit 700.

The incremental design analysis unit 700 includes a modified path unit 720. The modified path unit 720 identifies and eliminates candidate portions for preservation when the candidate portions are a part of a path that is partially modified. A path may include multiple connections between blocks. If a first connection is modified while a second connection is not, preserving the placement and routing design results for the unmodified connections may adversely impact timing closure since the properties of the entire timing path may require more optimization along the entire path.

The incremental design analysis unit 700 includes an interactive group unit 730. The interactive group unit 730 identifies and eliminates candidate portions for preservation when the candidate portions are highly interactive with non-candidate portions. Certain groups of blocks may have a high level of interaction with other blocks. For example, logic elements within a logic array block in an FPGA have a tendency to have a high level of interaction. When attempting to optimize a first set of blocks in a design, if the first set of blocks is highly interactive with a second set of blocks that have their placement and routing design results preserved (locked), optimization may be difficult. In such situations, it may be beneficial to not preserve any design results for the second set of blocks.

The incremental design analysis unit 700 includes an area analysis unit 740. The area analysis unit eliminates candidate portions that are in an area of the system with a large number of other candidate portions for preservation. Areas in a system having a large amount of locked logic may be difficult to optimize because the rest of the system has to be placed and routed around the locked logic. Unlocking portions that would otherwise be preserved in the system may provide needed flexibility to increase optimization. According to an embodiment of the present invention, various metrics may be analyzed to determine whether to eliminate candidate portions. For example, congestion, timing performance, logic density, power, clocking flexibility, and shared resource availability may be metrics that are analyzed.

The incremental design analysis unit 700 includes an optimization analysis unit 750. The optimization analysis unit 750 reverses decisions to preserve portions of the system if optimization conflicts with the preservation decisions. According to an embodiment of the present invention, optimization procedures implemented in synthesis, placement, or routing during incremental compilation that are based on making changes to a tentative design implementation record when proposed changes conflict with constraints for preservation implemented to enforce a portion that is preserved. Based on the conflict data recorded, preservation constraints may be removed to facilitate current or later optimization. Analysis of the conflict data may consider that not all relevant constraints need be removed in order facilitate optimization.

The incremental design analysis unit 700 includes a pruning unit 760. The pruning unit removes data from a data structure associated with the preserved portions and builds a proper subset of the data structure upon which the incremental compilation or compilation procedures operate on. Unused or preserved portions of the device-centric data structures may be pruned. According to an embodiment of the present invention, the data structures may be netlists of the system. The pruning unit 760 may perform the procedures described with reference to FIG. 3.

Embodiments of the present invention may be provided as a computer program product, or software, that may include an article of manufacture on a machine accessible, machine/computer readable medium having instructions. The instructions on the machine accessible or machine/computer readable medium may be used to program a computer system or other electronic device. The medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "machine accessible medium", "machine readable medium", or "computer readable medium" used herein shall include any medium that is capable of storing or encoding a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than a restrictive sense.

What is claimed is:

1. A method for designing a system on a target device, comprising:
   identifying a candidate portion in the system to preserve based on a quality of a design result of one or more portions of the system;
   applying preservation criteria on the candidate portion in the system to identify a portion of the system to preserve; and
   in response to the preservation criteria applied, performing incremental compilation on portions in the system that have not been preserved to generate a new design, wherein at least one of the identifying, applying, and performing is performed by a processor.

2. The method of claim 1, wherein the quality of the design result is based on at least one of congestion, timing performance, logic density, power, clocking flexibility, and shared resource availability.

3. The method of claim 1, wherein performing incremental compilation involves repeating a previously performed procedure to generate the new design.

4. The method of claim 1, wherein the identifying and applying are performed prior to placement.

5. The method of claim 1, wherein the identifying and applying are performed during or immediately after placement.

6. The method of claim 1, wherein the identifying and applying are performed during or immediately after routing.

7. The method of claim 1, further comprising pruning a data structure that represents portions in the system to preserve prior to performing incremental compilation.

8. The method of claim 7, further comprising stitching back sections of the data structure that were pruned.

9. A non-transitory computer readable medium including a sequence of instructions stored thereon for causing a computer to execute a method comprising:
   identifying a candidate portion in a system to preserve based on a quality of a design result of one or more portions of the system;
   applying preservation criteria on the candidate portion in the system to identify a portion of the system to preserve; and
   performing incremental compilation in response to the preservation criteria applied to generate a new design.

10. The non-transitory computer readable medium of claim 9, wherein the quality of the design result is based on at least one of congestion, timing performance, logic density, power, clocking flexibility, and shared resource availability.

11. The non-transitory computer readable medium of claim 9, wherein performing incremental compilation involves repeating a previously performed procedure to generate the new design.

12. The non-transitory computer readable medium of claim 9, wherein the identifying and applying are performed prior to placement.

13. The non-transitory computer readable medium of claim 9, wherein the identifying and applying are performed during or immediately after placement.

14. The non-transitory computer readable medium of claim 9, wherein the identifying and applying are performed during or immediately after routing.

15. The non-transitory computer readable medium of claim 9, wherein the method further comprises pruning a data structure that represents portions in the system to preserve prior to performing incremental compilation.

16. The non-transitory computer readable medium of claim 15, wherein the method further comprises stitching back sections of the data structure that were pruned.

17. A system designer comprising:
   a quality analysis unit to identify candidate portions in a system to preserve based on a quality of a design result of one or more portions of the system; and
   an incremental design analysis unit to apply preservation criteria on the candidate portions in the system to preserve; and
   an incremental compilation unit to perform incremental compilation in response to the preservation criteria applied to generate a new design.

18. The system designer of claim 17, wherein the quality of the design result is based on at least one of congestion, timing performance, logic density, power, clocking flexibility, and shared resource availability.

19. The system designer of claim 17, wherein performing incremental compilation involves repeating a previously performed procedure to generate the new design.

20. The system designer of claim 17, wherein the identifying and applying are performed prior to placement.

21. The system designer of claim 17, wherein the identifying and applying are performed during or immediately after placement.

22. The system designer of claim 17, wherein the identifying and applying are performed during or immediately after routing.

23. The system designer of claim 17, further comprising a pruning unit to prune a data structure that represents portions in the system to preserve prior to performing incremental compilation.

24. The system designer of claim 23, wherein the pruning unit stitches back sections of the data structure that were pruned.

* * * * *